(12) United States Patent
Koyama

(10) Patent No.: US 8,022,437 B2
(45) Date of Patent: Sep. 20, 2011

(54) ORGANIC ELECTROLUMINESCENCE ELEMENT AND METHOD FOR MANUFACTURING THEREOF

(75) Inventor: Hiroaki Koyama, Tokyo (JP)

(73) Assignee: Toppan Printing Co., Ltd. (JP)

( * ) Notice: Subject to any disclaimer, the term of this patent is extended or adjusted under 35 U.S.C. 154(b) by 86 days.

(21) Appl. No.: 12/497,413

(22) Filed: Jul. 2, 2009

(65) Prior Publication Data
US 2010/0078665 A1   Apr. 1, 2010

(30) Foreign Application Priority Data

Sep. 26, 2008   (JP) ................................ 2008-248147

(51) Int. Cl.
*H01L 33/00* (2010.01)
(52) U.S. Cl. ..... 257/100; 257/40; 257/93; 257/E33.059; 257/E33.061; 313/504; 438/26
(58) Field of Classification Search ............... 257/40, 257/79, 93, 100, E33.059, E33.061; 313/504; 438/26
See application file for complete search history.

(56) References Cited

U.S. PATENT DOCUMENTS

| | | | | |
|---|---|---|---|---|
| 6,525,339 | B2* | 2/2003 | Motomatsu | 257/40 |
| 2002/0038867 | A1* | 4/2002 | Kobori et al. | 257/40 |
| 2002/0067126 | A1* | 6/2002 | Van Den Reek et al. | 313/512 |
| 2006/0197095 | A1* | 9/2006 | Nakajima | 257/79 |
| 2010/0012961 | A1* | 1/2010 | Tobise | 257/98 |
| 2010/0045178 | A1* | 2/2010 | Matsuda et al. | 313/504 |
| 2010/0123126 | A1* | 5/2010 | Kitamura | 257/40 |
| 2010/0148661 | A1* | 6/2010 | Farquhar et al. | 313/504 |
| 2010/0243999 | A1* | 9/2010 | Ishikawa | 257/40 |
| 2010/0258797 | A1* | 10/2010 | Yamamoto et al. | 257/43 |

FOREIGN PATENT DOCUMENTS

| | | |
|---|---|---|
| JP | 07-169567 | 7/1995 |
| JP | 10-012376 | 1/1998 |
| JP | 2001-176655 | 6/2001 |
| JP | 2008-192426 | 8/2008 |

* cited by examiner

*Primary Examiner* — Ngan Ngo
(74) *Attorney, Agent, or Firm* — Squire, Sanders & Dempsey (US) LLP

(57) ABSTRACT

One embodiment of the present invention is an organic electroluminescence element having a substrate, a first electrode formed on the substrate, an organic luminescent medium layer which includes an organic luminescent layer and is formed on the first electrode, a second electrode formed on the organic luminescent medium layer and arranged so as to face the first electrode, a first passivation layer formed on the second electrode, an adhesive layer adhered to the substrate and formed so as to cover the first electrode, the organic luminescent medium layer, the second electrode and the first passivation layer, a sealing substrate formed on the adhesive layer and a second passivation layer formed so as to entirely cover the adhesive layer, the sealing substrate and an upper surface of an exposure part of the substrate.

10 Claims, 3 Drawing Sheets

Prior Art

ORGANIC ELECTROLUMINESCENCE ELEMENT AND METHOD FOR MANUFACTURING THEREOF

CROSS REFERENCE TO RELATED APPLICATION

This application is based on and claims the benefit of priority from the Japanese Patent Application number 2008-248147, filed on Sep. 26, 2008; the entire contents of which are incorporated herein by reference.

BACKGROUND OF THE INVENTION

1. Field of the Invention

The present invention relates to an organic electroluminescence element and the method for manufacturing thereof. In particular, the present invention relates to an organic electroluminescence element and a method for manufacturing thereof in which the transmission of moisture and oxygen is prevented.

2. Description of the Related Art

An organic electroluminescence element is expected to be used for various purposes, for example, a flat panel display such as a TV, a computer monitor or a mobile device and an illumination device.

An organic electroluminescence element is a self-luminous element, which is different from a liquid crystal display or the like. An organic electroluminescence element has the following merits. A structure can be extremely thin and a display image can be seen in a large field of view. Moreover, a response speed of an organic electroluminescence element display image is fast and power consumption is low. In addition, a contrast of an organic electroluminescence element is high. Therefore, because of the above merits, an organic electroluminescence element is expected as a flat panel display which takes the place of a cathode-ray tube display and a liquid-crystal display.

FIG. 4 is a schematic cross-sectional diagram of a hitherto known organic electroluminescence element 40. As shown in FIG. 4, a hitherto known organic electroluminescence element 40 has a first electrode 42 and a second electrode 44 on a glass substrate or a plastic substrate 41 and has a structure in which an organic luminescent medium layer 43 is between the two electrodes. At this time, at least one electrode has translucency. An organic electroluminescence element is a self-luminous element for a display in which an organic luminescent medium layer emits light by applying a voltage between the two electrodes. Moreover, an organic luminescent medium layer 43 includes a hole injection layer, a hole transport layer, an organic luminescent layer, and electron transport layer and an electron injection layer. As an example of the organic luminescent medium layer 43, copper phthalocyanine for a hole injection layer, (3,4-ethylenedioxythiophene)/polystyrene sulfonic acid (PEDOT/PSS) for a hole transport layer, Tris(8-quinolinol)aluminium for an organic luminescent layer, 2,5-bis(1-naphthyl)-1.3.4-oxadiazole for an electron transport layer and lithium fluoride for an electron injection layer can be exemplified. However, an organic electroluminescence element has a problem in that the organic electroluminescence element is degraded by external oxygen and moisture. Therefore, a following method has been generally used. First, an organic electroluminescence element is protected by a first passivation layer 45 and is sealed by a metal can or a glass cap 47 which includes a desiccant 48 using an adhesive layer 46. Next, an organic electroluminescence element is separated from the air. (See Patent Documents 1 and 2.) Here, the first passivation layer 45 has high barrier properties for oxygen and moisture and is preferred to have insulating characteristics since the first passivation layer 45 is formed on a second electrode (cathode) 44. For example, silicon nitride can be exemplified as the first passivation layer 45. Moreover, as an adhesive layer 46, an epoxy resin can be exemplified. As a desiccant 48, calcium oxide can be exemplified.

However, it is difficult to completely separate an organic electroluminescence element from oxygen and moisture which is degradation factors of an organic electroluminescence element. Therefore, for example, in patent document 3, a technique for eliminating harmful effects for an organic electroluminescence element while a moisture absorbent is fixed by a porous sheet is disclosed. (Patent Document 3)

Moreover, a glass cap is preferably not used in terms of a cost and production of a thin organic electroluminescence element. Therefore, a structure in which a sealing substrate having a flat sheet structure is used is required instead of using a glass cap. However, when a sealing substrate which has a flat sheet structure is used, a desiccant (a moisture absorbent) cannot be contained. Therefore, at this time, it is important to prevent transmission of moisture or oxygen through an adhesive layer itself and the interfacial surface of the adhesive layer and the sealing substrate without the desiccant. However, a degradation of an organic electroluminescence element cannot be prevented in this case, because the adhesive layer and the interfacial surface of the adhesive layer cannot be protected only by a first passivation layer directly formed an organic electroluminescence element.

As mentioned above, in order to obtain a thin organic electroluminescence element, it is important to protect against moisture and oxygen transmitted through the interfacial surface of an adhesive layer and a substrate. However, it is very difficult to protect an organic electroluminescence element sufficiently only by an adhesive layer because an adhesive layer can be peeled from the interracial surface under rapid temperature changes or under high temperature and high humidity environment. Therefore, a barrier layer is preferably formed in order to protect an adhesive layer itself from external atmosphere.

The purpose of the present invention is to provide a thin and light organic electroluminescence element having a long life and a method for manufacturing thereof in which penetration of oxygen and moisture into a sealing edge, in particular, an adhesive layer itself and the interfacial surface of the adhesive layer and a substrate is controlled for the long term.

Patent Document 1: JP-A-H7-169567
Patent Document 2: JP-A-H10-12376
Patent Document 3: JP-A-2001-176655

SUMMARY OF THE INVENTION

One embodiment of the present invention is an organic electroluminescence element having a substrate, a first electrode formed on the substrate, an organic luminescent medium layer which includes an organic luminescent layer and is formed on the first electrode, a second electrode formed on the organic luminescent medium layer and arranged so as to face the first electrode, a first passivation layer formed on the second electrode, an adhesive layer adhered to the substrate and formed so as to cover the first electrode, the organic luminescent medium layer, the second electrode and the first passivation layer, a sealing substrate formed on the adhesive layer and a second passivation layer formed so as to entirely cover the adhesive layer, the sealing substrate and an upper surface of an exposure part of the substrate.

10, 20, 30 and 40 each are organic electroluminescence elements, 11, 21, 31 and 41 each are substrates, 12, 22, 32 and 42 each are first electrode layers, 13, 23, 33 and 43 each are organic luminescent medium layers, 14, 24, 34 and 44 each are second electrode layers, 15, 25, 35 and 45 each are first passivation layers, 16, 26, 36 and 46 each are adhesive layers, 17, 28 and 37 each are sealing substrates, 18 and 29 each are second passivation layers, 27 is a third passivation film, 47 is a glass cap, 48 is a desiccant.

DETAILED DESCRIPTION OF THE DRAWINGS

The embodiments of the present invention are explained in detail below referring to the figures. In addition, duplicative explanations between the embodiments are omitted.

Figure 1:
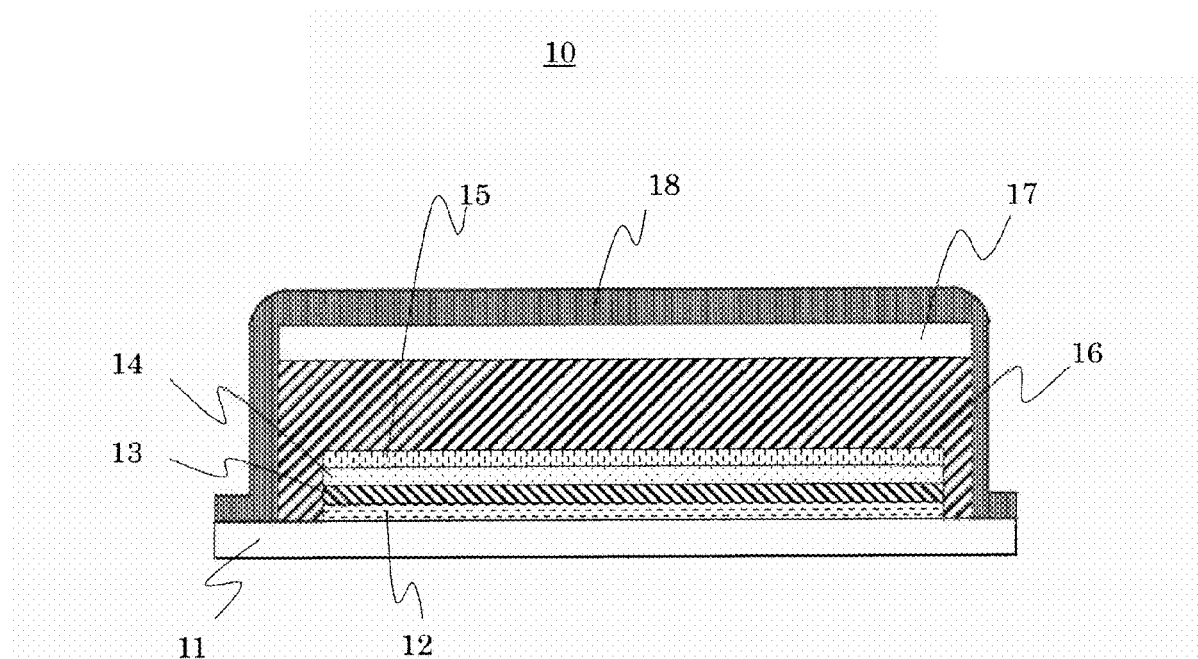
FIG. 1 is a schematic cross-sectional diagram of an organic electroluminescence element of an embodiment of the present invention.

FIG. 1 is a schematic cross-sectional diagram of an organic electroluminescence element 10 of an embodiment of the present invention. An organic electroluminescence element of an embodiment of the present invention and a method for manufacturing thereof are explained below. However the present invention is not limited to this embodiment. Moreover, an organic electroluminescence element 10 of an embodiment of the present invention has a passive matrix type. However, an organic electroluminescence element of an active matrix type can also be manufactured by the same process. In addition, an organic electroluminescence element 10 of one embodiment of the present invention has a bottom emission type. However, an organic electroluminescence element of a top emission type can also be applicable.

As shown in FIG. 1, an organic electroluminescence element 10 of an embodiment of the present invention has a substrate 11, a first electrode layer 12 formed on the substrate 11, an organic luminescent medium layer 13 formed on the first electrode layer 12, a second electrode layer 14 formed on the organic luminescent medium layer 13, a first passivation layer 15 formed on the second electrode layer 14, an adhesive layer 16 formed so as to cover the first electrode layer 12, the organic luminescent medium layer 13, the second electrode layer 14 and the first passivation layer 15 and adhered to the substrate 11, a sealing substrate 17 formed on the adhesive layer 16 and a second passivation layer 18 formed so as to entirely cover the adhesive layer 16, the sealing substrate 17 and an upper surface of an exposure part of the substrate 11.

As the substrate 11 of an organic electroluminescence element 10 of an embodiment of the present invention, a substrate having insulating properties such as a glass or a plastic film can be used.

When the substrate 11 is a glass or a plastic film, it is preferred to eliminate moisture within the substrate and on the surface of the substrate 11 as much as possible by performing a heating process beforehand. In addition, depending on a material stacked on the substrate 11, it is preferred to use the substrate 11 on which a surface treatment such as ultrasonic cleaning processing, corona discharge treatment, plasma processing or ultra violet ozone treatment has been performed, in order to improve adhesion.

The first electrode layer 12 of an organic electroluminescence element 10 of an embodiment of the present invention applies a voltage to the organic luminescent medium layer 13 with the second electrode layer 14. The first electrode layer 12 is patterned into a stripe shape and the second electrode layer 14 is patterned so as to be perpendicular to the first electrode layer 12 in order that the first electrode layer 12 and the second electrode layer 14 apply a voltage to each pixel respectively.

Either the first electrode layer 12 or the second electrode layer 14 is required to be transparent. That is because light is taken out from the organic luminescent medium layer 13.

For example, ITO (indium tin composite oxide) or IZO (indium zinc composite oxide) can be used as the first electrode layer 12. As a method for forming the first electrode layer 12, a vacuum film-formation method such as a resistance heating deposition method, an electron beam deposition method, a reactive deposition method, an ion plating method, a sputtering method can be used.

The organic luminescent medium layer 13 of an organic electroluminescence element 10 of an embodiment of the present invention includes an organic luminescent layer which emits light by applying a voltage. The organic luminescent medium layer may have a single layer structure made of an organic luminescent layer or a multilayer structure in which a luminescent auxiliary layer is stacked which improves luminescence efficiency in addition to an organic luminescent layer. As a luminescent auxiliary layer, a hole transport layer, a hole injection layer, an electron transport layer, an electron injection layer or the like can be used.

As a luminescent auxiliary layer of the organic luminescent medium layer 13, for example, a hole injection layer including copper phthalocyanine, metallophthalocyanine such as tetra(t-butyl)copper phthalocyanine, metal-free phthalocyanine, quinacridon chemical compound or an aromatic amine type low molecular such as 1,1-bis(4-di-p-tolylamino phenyl) cyclohexane,N,N'-diphenyl-N,N'-bis(3-methylphenyl)-1,1'-biphenyl-4,4'-diamine, N,N'-di(1-naphthyl)-N,N'-diphenyl-1,1'-biphenyl-4,4'-diamine can be used.

In addition, a hole transport layer including, for example, polyaniline, polythiophene, polyvinylcarbazole, poly(3,4-ethylenedioxy thiophene), poly(3,4-ethylenedioxy thiophene)/polystyrene sulfonate (PEDOT/PSS) or the like can be used.

Moreover, an organic luminescent layer including a low molecular material such as phosphorescent luminous body such as 9,10-diaryl anthracenes, pyrene, coronene, perylene, rubrene, 1,1,4,4-tetra phenylbutadiene, tris(8-quinolinolato) aluminium complex, tris(4-methyl-8-quinolinolato)aluminium complex, bis(8-quinolinolato)zinc complex, tris(4-methyl-5-trifluoromethyl-8-quinolinolato)aluminium complex, tris(4-methyl-5-cyano-8-quinolinolato)aluminium complex, bis(2-methyl-5-trifluoromethyl-8-quinolinolato) [4-(4-cyanophenyl)phenolate]aluminium complex, bis(2-methyl-5-cyano-8-quinolinolate)[4-(4-cyanophenyl)phenolate]aluminium complex, tris(8 quinolinolate)scandium complex, bis[8-(para-tosyl)aminoquinoline]zinc complex and cadmium complex, 1,2,3,4-tetraphenylcyclopentadiene, pentaphenylcyclopentadiene, poly-2,5-diheptyloxi-para-phenylenevinylene, coumalin series phosphor, perylene series phosphor, pyrane series phosphor, anthrone series phosphor, porphyrin series phosphor, quinacridone series phosphor, N,N'-dialkyl substitution quinacridone series phosphor, naphthalimide series phosphor, N,N'-substituted pyrrolo pyrrole series phosphor or Ir complex can be used.

In addition, an organic luminescent layer including a high molecular material such as polyfluorene, poly(p-phenylene vinylene, polythiophene, polyspiro or the like can be used. In addition, a material in which the low molecular material is dissolved in the high molecular material, a material in which the low molecular material is copolymerized with the high molecular material or other existing luminous materials can also be used as an organic luminescent layer.

The film of the organic luminescent medium layer 13 which is mentioned above can be formed by a dry coating method or a wet coating method depending on the molecule characteristic. As a wet coating method, a spin coating method, a bar coating method, an ejection coating method, and a dip coating method can be exemplified. As a dry coating method, a vacuum film-formation method such as a resistance heating deposition method, an electron beam deposition method a reactive deposition method, an ion plating method or a sputtering method can be used.

As the second electrode layer 14 of an organic electroluminescence element of an embodiment of the present invention, for example, a metal simple substance such as lithium, magnesium, calcium, ytterbium or aluminum and alloy of the metal simple substance and stable metal such as gold or argentine can be exemplified. However, the present invention is not limited to this. As a method for forming film of the second electrode layer 14, a vacuum film-formation method such as a resistance heating deposition method, an electron beam deposition method, a reactive deposition method, an ion plating method or a sputtering method can be used.

As the first passivation layer 15 of an organic electroluminescence element 10 of an embodiment of the present invention, for example, silicon nitride, aluminum oxide, silicon oxide or calcium fluoride can be exemplified. However, the present invention is not limited to these. For the first passivation layer 15, a substance which has insulating properties and is stable for moisture and oxygen can be used. As a method for forming the film of the first passivation layer 15, a vacuum film-formation method can be used. For example, a resistance heating deposition method, an electron beam deposition method, a reactive deposition method, an ion plating method or a sputtering method can be used.

As the adhesive layer 16 of an organic electroluminescence element 10 of an embodiment of the present invention, for example, a thermoset adhesive material can also be used. However, considering an influence for an organic electroluminescence element 10, a photo-curable adhesive layer is preferable. For example, a radical system adhesive which has a resin such as each kind of acrylate such as ester acrylates, urethane acrylates, epoxy acrylate, melamine acrylates or acrylic resin acrylates or urethane polyester acrylates can be exemplified. Moreover, a cation-based adhesive which has a resin such as epoxy or vinyl ether, or a thiolene-added resin adhesive can be exemplified. Among the above, a cation-based adhesive which is not disturbed by oxygen and can have continuous polymerization reaction even after light irradiation is preferably used.

As a cation-based curable type, an ultraviolet curable epoxy resin adhesive layer is preferably used. In particular, an ultraviolet curable adhesive layer which can be hardened within 10-90 seconds at the time of irradiating more than 100 mW/cm$^2$ ultraviolet rays is preferable. By hardening within this time, other formations are not badly effected by irradiation of ultraviolet rays. In addition, an ultraviolet curable adhesive layer can be hardened sufficiently and has appropriate adhesion.

Moreover, in terms of efficiency of a manufacturing process, the adhesive layer is preferred to be hardened within 10-90 seconds. Furthermore, regardless of the kinds of the adhesive layer 16, an adhesive layer having low moisture permeability and high adhesion properties is preferably used. The adhesive layer 16 can be of any thickness. However, the thickness is preferred to be as thin as possible. The thickness is preferred to be about 1-100 μm, more preferably 5-50 μm. A later described sealing substrate material 17 is formed on the adhesive layer 16. The adhesive layer 16 can be stacked on the first passivation layer 15 by adhering to the substrate 11 so as to entirely cover the first electrode 12, the organic luminescent medium layer 13, the second electrode 14 and the first passivation layer 15. As a method for forming the adhesive layer 16 on the first passivation layer 15, the solvent solution method, pushing out laminate method, fusion/hot melt method, calender method, discharge jet application method, screen printing, vacuum laminate method and heated roll laminate method can be used.

As the sealing substrate 17 of an organic electroluminescence element 10 of an embodiment of the present invention, a glass, a plastic film such as polyethylene terephthalate (PET), polyether sulfone (PES), or polyethylene naphthalate (PEN), polyethylene, polypropylene, cellophane, cellulose Diacetate, cellulose Triacetate, cellulose acetate butyrate, cellulose acetate propionate (CAP), cellulose acetate phthalate (TAC), polyvinylidene chloride, polyvinyl alcohol, polyethylene vinyl alcohol, syndiotactic polystyrene, polycarbonate, norbornene resin, polymethylpentene, polyether ketone, polyimide, poly phenylene sulfide, polysulfone, polyetherimide, polyetherketoneimide, polyamide, fluorine resin, nylon, polymethylmethacrylate or acrylic can be used. In addition, in the case of an organic electroluminescence element of a bottom emission type, the sealing substrate 17 is not required to be transparent. Therefore, an opaque material such as a metal foil such as an almunium foil or such as a metal plate can also be used.

Figure 2:
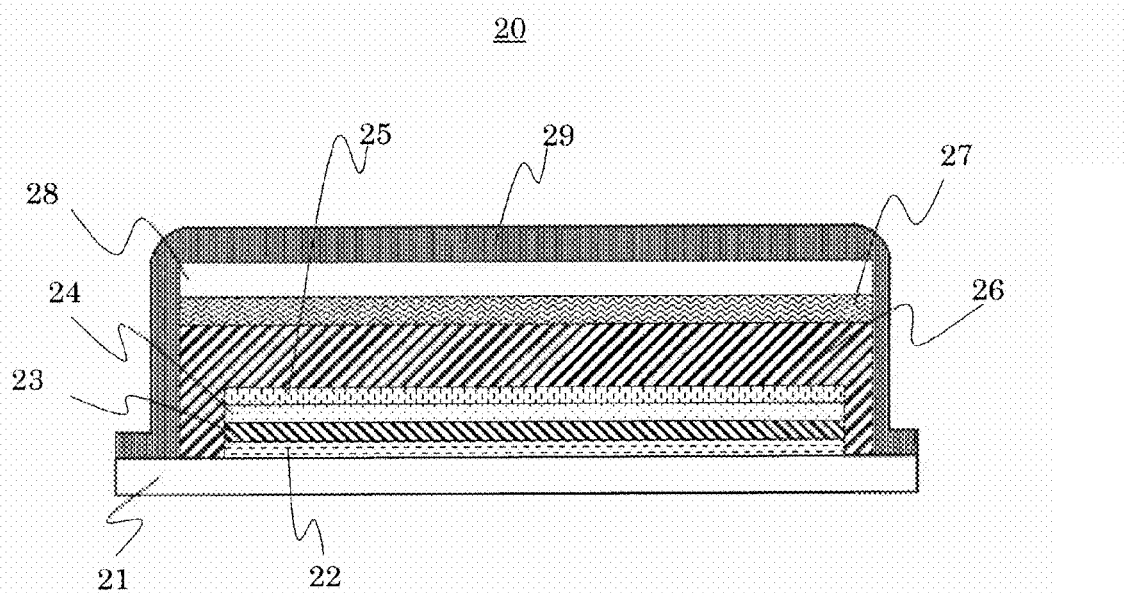
FIG. 2 is a schematic cross-sectional diagram of an organic electroluminescence element of an embodiment of the present invention.

Generally, sealing properties of a plastic film are inferior to those of a glass and a metal foil. However, according to the present invention, the sealing properties can be improved, because the second passivation layer 18 is stacked on the sealing substrate 17 after adhesion and covers the edge part of an element including the sealing substrate 17 and the adhesive layer 16 as mentioned later. Therefore, a plastic film which is inexpensive can be used preferably. Moreover, when a plastic film is used, forming the film of a substance which has barrier properties on the sealing substrate 17 beforehand is effective for achieving a longer life for an organic electroluminescence element. In an organic electroluminescence element of the present invention shown in FIG. 2, a third passivation film 27 is formed on the side where the sealing substrate 28 is adhered to the adhesive layer 26. Sealing properties can be improved when the above structure is formed. Moreover, adhesion becomes easier, because a plastic film which is flexible can be used. As the third passivation layer 27, for example, silicon nitride, aluminuim oxide, silicom oxide, calcium fluoride or the like, which is a substance having barrier properties, can be exemplified However, a usable material is not limited to these. The film of a substance which has insulating properties and is stable for moisture and oxygen can also be formed by a vacuum film-formation method such as a resistance heating deposition method, an electron beam deposition method, a reactive deposition method, an ion plating method or a sputtering method.

An adhesion in a vacuum condition is preferably used for a method for bonding the sealing substrate 17 on which the adhesive layer 16 has been formed. This is because to eliminate bubbles as much as possible when the sealing substrate is adhered and to prevent a degradation of an organic electroluminescence element.

As the second passivation layer 18 of an organic electroluminescence element of an embodiment of the present invention, for example, silicon nitride, silicon oxynitride can be exemplified. However, a usable material is not limited to these. As the second passivation layer 18, a substance having insulating properties and is stable for moisture and oxygen can be used. Moreover, in order to form a film on the sealing substrate 17 and around the sealing substrate 17, a CVD method which has high coverage properties is preferably used for forming a film. A vacuum deposition method, an EB deposition method or a sputtering method does not have sufficient coverage properties, because the edge of the substrate is hidden from a deposition source. Therefore, these methods are not suitable for forming a passivation film.

By forming the second passivation layer 18 so as to cover the wall surface of the edge part of an element, the exposure part of the adhesive layer 16 can be covered and sealing properties can be improved.

In an organic electroluminescence element of an embodiment of the present invention, transmission of moisture and oxygen through the interfacial surface of the sealing substrate 17 and the adhesive layer 16 and the adhesive layer 16 itself is prevented by forming the second passivation layer 18 so as to entirely cover the adhesive layer, the sealing substrate and an upper surface of the substrate of an organic electroluminescence element. Therefore, a degradation of the organic electroluminescence element 10 can be prevented and the organic electroluminescence element 10 which has a long life can be obtained.

EXAMPLE 1

Next, the present invention is explained using examples and comparative examples. However, the present invention is not limited to the examples.

As shown in FIG. 1, first, a first electrode layer 12 was formed by forming a film which has ITO so as to have a thickness of 50 nm on a substrate 11 made of a glass by a sputtering method.

Next, a hole transport layer having a mixture of poly(3,4-ethylenedioxy thiophene) and polystyrene sulfonic acid was formed so as to have a thickness of 20 nm on a first electrode 12 by a spin coating method.

Next, an organic luminescent layer was formed on the hole transport layer by a spin coating method by dissolving poly [2-methoxy-5-(2'-ethyl-hexyloxy)-1,4-phenylene vinylene] which is an organic luminescence material in toluene. In addition, an organic luminescent medium layer was formed so as to have a thickness of 80 nm by combining the formed hole transport layer and the organic luminescent layer.

Next, a second electrode 14 having Ca (Calcium) and Al (Alminum) was formed on the organic luminescent medium layer 13 by forming a film of Ca with a thickness of 5 nm and a film of Al with a thickness of 50 nm by a resistance heating deposition method which is a vacuum deposition method.

Next, a first passivation layer 15 having SiO was formed so as to have a thickness of 100 nm on the second electrode 14 by an electron beam deposition method.

Next, an adhesive layer 16 having an ultraviolet curable adhesive layer 16 was formed on the passivation layer 15 so as to entirely cover the first electrode 12, the organic luminescent medium layer 13 and the second electrode 14. In addition, an organic electroluminescence element was sealed by a sealing substrate 17 made of a flat glass.

Next, a second passivation layer 18 having silicon nitride was formed so as to have a thickness of 1000 nm on the sealed organic electroluminescence element by a plasma CVD method with $SiH_4$: 60 sccm, $NH_3$: 20 sccm, $H_2$: 200 sccm, 100 Pa of total pressure and 10 kW of electric power.

As the result of applying a voltage of 5V to the manufactured organic electroluminescence element by this method, brightness of 3200 $cd/m^2$ was provided. This property was the same as that of an element in which a first passivation layer was not formed. Moreover, although the organic electroluminescence element was left standing for 1500 hours under the condition of 60 degrees Celsius and 90% RH, a rate of decrease of a luminescent area was less than 1%.

EXAMPLE 2

In Example 2, a PEN film with a thickness of 15 μm was used as a sealing substrate 17. Then, an organic electroluminescence element 10 was manufactured by the same process as shown in the Example 1 except the above.

As the result of applying a voltage of 5V to the manufactured organic electroluminescence element 10, brightness of 3000 $cd/m^2$ was provided. Moreover, although the organic electroluminescence element was left standing for 1500 hours under the condition of 60 degrees Celsius and 90% RH, a rate of decrease of a luminescent area was less than 3%.

EXAMPLE 3

In Example 3, an inorganic oxide as a third passivation layer 27 was formed on a PEN film with a thickness of 15 μm which was used as a sealing substrate so that the sealing substrate had barrier properties. An organic electroluminescence element 20 was manufactured by the same process as shown in the Example 1 except the above. As an inorganic oxide, $SiO_2$ and $Al_2O_3$ were used. The film of $SiO_2$ was formed so as to have a thickness of 100 nm, and the film of $Al_2O_3$ was formed so as to have a thickness of 50 nm. In addition, the film of $SiO_2$ and the film of $Al_2O_3$ were formed on the PEN film by an EB deposition method. Thereafter, the sealing substrate 28 was arranged so that the third passivation layer 27 is located on the adhesive layer 26.

As the result of applying a voltage of 5V to the manufactured organic electroluminescence element 20, brightness of 2600 $cd/m^2$ was provided. Moreover, although the organic electroluminescence element was left standing for 1500 hours under the condition of 60 degrees Celsius and 90% RH, a rate of decrease of a luminescent area was less than 3%.

COMPARATIVE EXAMPLE 1

Figure 4:
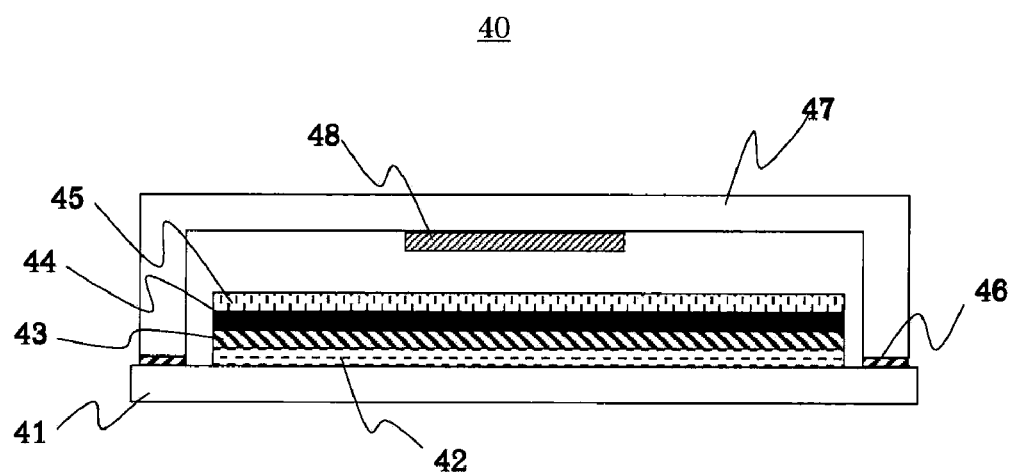
FIG. 4 is a schematic cross-sectional diagram of a hitherto known organic electroluminescence element.

In Comparative Example 1, an organic electroluminescence element 40 having a glass cap 47 which includes a desiccant 48 was manufactured as shown in FIG. 4 without forming the second passivation layer 18 used in Example 1.

As the result of applying a voltage of 5V to the manufactured organic electroluminescence element 40, brightness of 3100 $cd/m^2$ was provided. Moreover, although the organic electroluminescence element was left standing for 1500 hours under the condition of 60 degrees Celsius and 90% RH, a rate of decrease of a luminescent area was less than 8%.

Here, the organic electroluminescence element 10 of Example 1 has almost the same brightness compared with the organic electroluminescence element 40 of Comparative Example 1. Moreover, after the organic electroluminescence element 10 was left standing under the condition of 60 degrees Celsius and 90% RH, a rate of decrease of a luminescent area decreased by 7% compared with that of the organic electroluminescence element 40 which had the glass cap 47 and the desiccant 48. This indicated that in the organic electroluminescence element 10 of Example 1, transmission of humidity though the interfacial surface of the adhesive layer 16 and the glass substrate 11 was prevented more by forming the second passivation layer 18. Moreover, the organic electroluminescence element 10 was sufficiently protected without the desiccant 38 of Comparative Example 1.

In addition, when Example 2 and Comparative Example 1 were compared, there was no remarkable difference in brightness. However, a rate of decrease of a luminescent area decreased by 5% in Example 2 and the organic electroluminescence element was highly protected by the second passivation layer 18. In addition, Example 2 was favorable for manufacturing a thinner organic electroluminescence element, because the sealing substrate 17 had sufficient sealing properties even if the sealing substrate was made of a PEN film.

COMPARATIVE EXAMPLE 2

Figure 3:
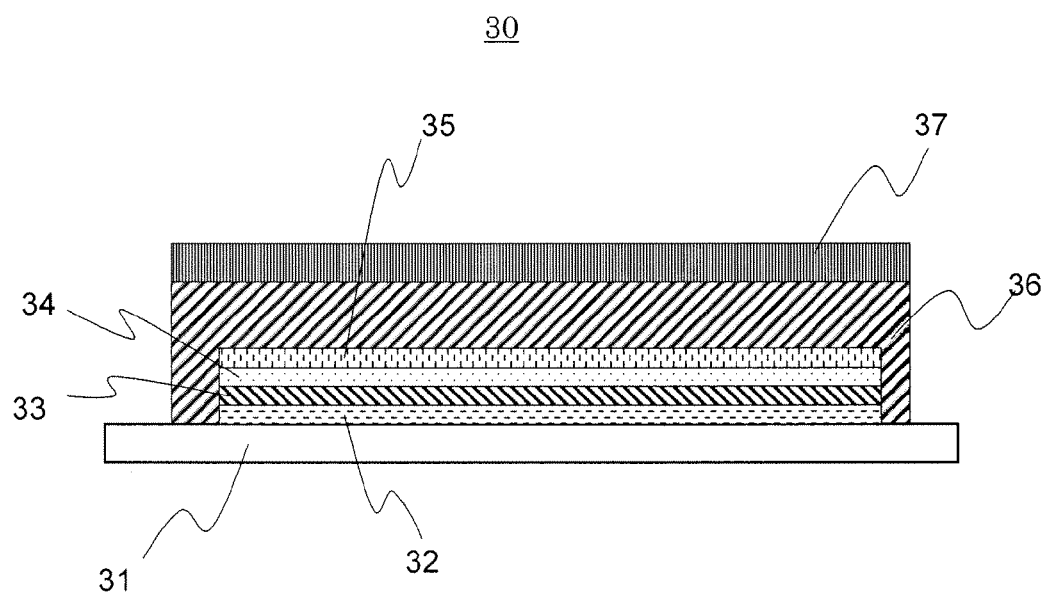
FIG. 3 is a schematic cross-sectional diagram of an organic electroluminescence element of a comparative example.

In Comparative Example 2, the second passivation layer 18 of Example 1 was not formed as shown in FIG. 3.

An organic electroluminescence element 30 was manufactured by the same process as shown in Example 1 except the above.

As the result of applying a voltage of 5V to the manufactured organic electroluminescence element 30, brightness of 3500 cd/m² was provided. Moreover, although the organic electroluminescence element was left standing for 500 hours under the condition of 60 degrees Celsius and 90% RH, a rate of decrease of a luminescent area reached to 10%.

When Example 1 and Comparative Example 2 were compared, a rate of decrease of a luminescent area was more than twice as low as that of Comparative Example 2, because the second passivation layer 18 was formed in Example 1. Transmission of degradation factors of the organic electroluminescence element 10 was prevented, because the second passivation layer 18 which included a film of silicon nitride covered the interfacial surface of the substrate 11 and the adhesive layer 16.

What is claimed is:

1. An organic electroluminescence element comprising:
a substrate;
a first electrode formed on said substrate;
an organic luminescent medium layer which includes an organic luminescent layer formed on said first electrode;
a second electrode formed on said organic luminescent medium layer and arranged so as to face said first electrode;
a first passivation layer formed on said second electrode;
an adhesive layer adhered to said substrate and formed so as to cover said first electrode, said organic luminescent medium layer, said second electrode and said first passivation layer;
a sealing substrate formed on said adhesive layer; and
a second passivation layer continuously formed so as to entirely cover said adhesive layer, said sealing substrate and an upper surface of an exposure part of said substrate.

2. The organic electroluminescence element according to claim 1, wherein said sealing substrate has a flat sheet structure.

3. The organic electroluminescence element according to claim 1, wherein said first passivation layer includes one of metal oxide, metal nitride, metal oxynitride and metal fluoride.

4. The organic electroluminescence element according to claim 1, wherein said second passivation layer includes silicon nitride or silicon oxynitride.

5. The organic electroluminescence element according to claim 1, further comprising a third passivation layer formed between said sealing substrate and said adhesive layer, and wherein said sealing substrate is made of a plastic film.

6. A method for manufacturing an organic electroluminescence element comprising: preparing a substrate;
forming a first electrode on said substrate;
forming an organic luminescent medium layer which includes an organic luminescent layer on said first electrode;
forming a second electrode so as to face said first electrode and forming said organic luminescent medium layer between said first electrode and said second electrode;
forming a first passivation layer on said second electrode;
forming an adhesive layer so as to be adhered to said substrate and cover said first electrode, said organic luminescent medium layer, said second electrode and said first passivation layer;
forming a sealing substrate on said adhesive layer, and
forming a second passivation layer so as to entirely cover said adhesive layer, said sealing substrate and an upper surface of an exposure part of said substrate.

7. The method for manufacturing an organic electroluminescence element according to claim 6, wherein said sealing substrate has a flat sheet structure.

8. The method for manufacturing an organic electroluminescence element according to claim 6, wherein said first passivation layer includes one of metal oxide, metal nitride, metal oxynitride and metal fluoride.

9. The method for manufacturing an organic electroluminescence element according to claim 6, further comprising forming said second passivation layer by a CVD method.

10. The method for manufacturing an organic electroluminescence element according to claim 6, wherein said sealing substrate is a plastic film having a third passivation layer on at least one side of the plastic film and wherein said adhesive layer is adhered to said one side of said plastic film where said third passivation layer is formed.

* * * * *